(12) United States Patent
Nakanishi et al.

(10) Patent No.: US 6,265,730 B1
(45) Date of Patent: Jul. 24, 2001

(54) THIN-FILM TRANSISTOR AND METHOD OF PRODUCING THE SAME

(75) Inventors: Shiro Nakanishi; Tsutomu Yamada, both of Ohgaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/161,870

(22) Filed: Sep. 28, 1998

(30) Foreign Application Priority Data

Sep. 30, 1997 (JP) .................................................. 9-266705

(51) Int. Cl.[7] .................................................. H01L 29/786
(52) U.S. Cl. .................................. 257/57; 257/58; 257/70; 257/62
(58) Field of Search .................................. 257/57, 62, 58, 257/70

(56) References Cited

U.S. PATENT DOCUMENTS

| | | |
|---|---|---|
| 5,130,772 | 7/1992 | Choi . |
| 5,296,729 | 3/1994 | Yamanaka et al. . |
| 5,440,168 | 8/1995 | Nishimura et al. . |
| 5,468,986 | 11/1995 | Yamanashi . |
| 5,616,933 | * 4/1997 | Li .......................................... 257/57 |
| 5,917,225 | 6/1999 | Yamazaki et al. . |

FOREIGN PATENT DOCUMENTS

| | | |
|---|---|---|
| 58-137215 | 8/1983 | (JP) . |
| 64-53559 | 3/1989 | (JP) . |

OTHER PUBLICATIONS

Wolf, Silicon Processing for the VLSI Era, vol. 1, 1986, p. 522.

* cited by examiner

Primary Examiner—Jerome Jackson, Jr.
(74) Attorney, Agent, or Firm—Cantor Colburn LLP

(57) ABSTRACT

A thin-film transistor is provided in which the thickness of the insulating film is optimized. A gate electrode is formed on a transparent substrate. A silicon nitride film and a silicon oxide film, acting as a gate insulating film, are formed over the transparent substrate. A polycrystalline silicon film, being a semiconductor film, is formed acting as an active region. A stopper is formed on the polycrystalline silicon film corresponding to the gate electrode. A silicon oxide film and a silicon nitride film, acting as an interlayer insulating film, are deposited as to cover the stopper region. The total film thickness T1 of the stopper and the silicon oxide film is formed to be thinner than (the thickness T2 of the silicon nitride film×8000 Å)$^{1/2}$. This structure allows hydrogen atoms to be sufficiently supplied from the silicon nitride film into the polycrystalline silicon film via the stopper and the silicon oxide film, so that crystalline defects in the polycrystalline silicon film can be filled with the hydrogen atoms.

10 Claims, 7 Drawing Sheets

THIN-FILM TRANSISTOR AND METHOD OF PRODUCING THE SAME

BACKGROUND OF THE INVENTION

1. Field of the Invention

The present invention relates to a thin-film transistor (TFT) suitable for pixel display switching elements in an active matrix display scheme and to a method of producing the same.

2. Description of the Related Art

FIG. 1 is a cross sectional view illustrating the structure of a bottom gate type thin-film transistor. In fabrication of the thin film transistor, a gate electrode 2 of a high-melting point metal such as tungsten or chromium is formed on the surface of an insulating transparent substrate 1. Both sides of the gate electrode 2 are externally tapered on the transparent substrate 1. A silicon oxide film 4 is deposited via a silicon nitride film 3 on the transparent substrate 1 on which the gate electrode 2 is disposed. The silicon nitride film 3 blocks impurities contained in the transparent substrate 1 from intruding into an active region (to be described later). The silicon oxide film 4 works as a gate insulating film. A poly crystalline silicon film 5 is stacked on the silicon oxide film 4 to cross the gate electrode 2. The polycrystalline silicon film 5 acts as an active region.

A stopper 6 of an insulating material such as silicon oxide is formed on the polycrystalline silicon film 5. The polycrystalline silicon film 5 covered with the stopper 6 acts as a channel region 5c while the remaining polycrystalline silicon films 5 respectively act as a source region 5s and a drain region 5d. The silicon oxide film 7 and the silicon nitride film 8 are stacked on the polycrystalline silicon film 5 on which the stopper 6 is formed. Both the silicon oxide film 7 and the silicon nitride film 8 act as an interlayer insulating film for protecting the polycrystalline silicon film 5 including the source region 5c and the drain region 5d and for dispositing the drain line.

A contact hole 9 is formed in a predetermined position of the silicon oxide film 7 and the silicon nitride film 8 formed over the source region 5s while a contact hole 9 is formed in a predetermined position of the silicon oxide film 7 and the silicon nitride film 8 formed over the source region 5d. A source electrode 10s to be connected to the source region 5s is formed in the contact hole 9 while a source electrode 10d to be connected to the drain region 5d is formed in the contact hole 9. An acrylic resin layer 11 transparent to visible rays is stacked over the silicon nitride film 8 in which the source electrode 10s and the drain electrode 10d are formed. The rough surface caused by the gate electrode 2 and the stopper 6 is buried with the acrylic resin layer 11 to become a flat surface.

A contact hole 12 is formed in the acrylic resin film 11 on the source electrode 10s. An ITO (Indium Tin Oxide) transparent electrode 13 is connected to the source electrode 10s via the contact hole 12 and extends toward the surface of the acrylic resin layer 11. The transparent electrode 13 acts as a pixel electrode for the liquid crystal display panel.

A plurality of the above-mentioned thin-film transistors are disposed in a matrix form on the transparent substrate 1, together with pixel electrodes 13. Image data supplied to the drain electrodes 10d is input to the pixel electrodes in response to scanning control signals applied to the gate electrodes 2.

The polycrystalline silicon film 5 is preferably formed with polycrystalline silicon of sufficiently large grain size to act as an active region of a thin-film transistor. The excimer laser annealing method is known as a method of increasing the grain size of the polycrystalline silicon film 5. In this laser annealing method, an amorphous silicon is deposited on the silicon oxide film 4 acting as a gate insulating film. Hydrogen contained in the amorphous silicon film is expelled through a heating process at low temperatures. Then the silicon is temporarily melted by irradiating the excimer laser and is then recrystallized. Since a desired portion on the transparent substrate 1 is locally heated to a high temperature using the laser annealing method, a glass with a low melting point can be used as the transparent substrate 1.

Since the polycrystalline silicon film 5 crystallized through the laser annealing method has many crystalline defects, electrons moving therein tend to be easily trapped. Hence, the crystallized silicon is not desirable as the active region in the transistor. In order to solve such problems, an insulating film containing a great number of hydrogen atoms is formed on the polycrystalline silicon layer 5 temporarily formed. The crystalline defects are then buried with hydrogen atoms by annealing the insulating film in a nitrogen atmosphere.

A silicon nitride film is known as an insulating film containing a large number of hydrogen atoms. The hydrogen atom concentration of a silicon nitride film formed through the plasma CVD method is normally order of $10^{22}/cm^3$ and is larger by two digits, compared with the hydrogen atom concentration (order of $10^{20}/cm^3$) in the silicon oxide film formed through the plasma CVD method. For that reason, silicon nitride films are used as a hydrogen atom supply source.

Generally, since the silicon nitride film formed on the active region deteriorates the characteristics of a transistor, a silicon oxide film is formed between the active region and the silicon nitride film as shown in FIG. 1. However, the silicon oxide film 7 of a critical film thickness lying between the polycrystalline silicon film 5 and the silicon nitride film 8 may not supply sufficient hydrogen atoms into the polycrystalline silicon film 5. This problem means that a high-temperature annealing process or prolonged annealing time are required in fabrication steps, thus resulting in a decrease in productivity.

SUMMARY OF THE INVENTION

The present invention is made to solve the above-mentioned problems.

Moreover, the objective of the invention is to provide a thin-film transistor in which crystalline defects in a semiconductor film are effectively buried with hydrogen atoms to optimize the film thickness.

Another objective of the invention is to provide a method of manufacturing a thin-film transistor in which crystalline defects in a semiconductor film are effectively buried with hydrogen atoms to optimize the film thickness.

According to the present invention, a thin-film transistor comprises a gate electrode formed on a substrate; a gate insulating film formed on the gate electrode formed on the substrate; a semiconductor film formed on the gate insulating film; and an interlayer insulating film stacked on the semiconductor film; wherein the interlayer insulating film including a silicon oxide film in contact with the semiconductor film and a silicon nitride film in contact with the silicon oxide film; the thickness of the silicon oxide being set to a value of equal or less than (a thickness of the silicon nitride×8000 Å)$^{1/2}$.

According to the present invention, the thin-film transistor further comprises a stopper region formed on a channel region of the semiconductor film; the total thickness of the stopper film and the silicon oxide being set to a value of equal or less than (a film thickness of the silicon nitride× 8000 Å)$^{1/2}$.

Moreover, according to the present invention, a thin-film transistor comprises a semiconductor film formed on a substrate; a gate insulating film formed over the semiconductor substrate; a gate electrode formed on the gate insulating film so as to cross to the semiconductor film; and an interlayer insulating film formed on the gate insulating film so as to cover the gate electrode; the interlayer insulating film including a silicon oxide film in contact with the semiconductor film and a silicon nitride film in contact with the silicon oxide film; the thickness of the silicon oxide being set to a value of equal or less than (a thickness of the silicon nitride×8000 Å)$^{1/2}$.

In the thin-film transistor according to the present invention, the total thickness of the gate insulating film and the silicon oxide is set to a value of equal or less than (a thickness of the silicon nitride×8000 Å)$^{1/2}$.

According to the present invention, a silicon oxide film and a silicon nitride film are formed as an interlayer insulating film on a semiconductor film acting as an active region. The silicon nitride film acts as a supply source for introducing hydrogen atoms into the semiconductor film. The silicon oxide film prevents the silicon nitride film from coming into contact with the semiconductor film. Since the thickness of the silicon oxide film is varied according to the thickness of the silicon nitride film, the silicon oxide film does not block hydrogen atoms introduced from the silicon nitride film into the semiconductor film.

In another aspect of the present invention, a thin-film transistor manufacturing method comprises a first step of forming a gate electrode on a major surface of a substrate; a second step of forming a gate insulating film on the substrate so as to cover the gate electrode and then forming a semiconductor film on the gate insulating film; a third step of forming an interlayer insulating film on the semiconductor film; and a fourth step of heating the semiconductor film and the interlayer insulating film at a predetermined temperature to introduce hydrogen atoms contained in the interlayer insulating film into said semiconductor film; wherein said third step including sub-steps of stacking a silicon oxide film in contact with said semiconductor film to a first film thickness, and stacking a silicon nitride film in contact with said silicon oxide film to a second film thickness, said first film thickness being set to a value of equal or less than (said second film thickness×8000 Å)$^{1/2}$.

Furthermore, according to the present invention, a thin-film transistor manufacturing method comprises a first step of forming a semiconductor film on a major surface of a substrate; a second step of forming a gate insulating film on the semiconductor film and forming the gate electrode on the gate insulating film so as to cross the semiconductor film; a third step of forming an interlayer insulating film on the gate insulating film so as to cover the gate electrode; and a fourth step of heating the interlayer insulating film at a predetermined temperature to introduce hydrogen atoms contained in the interlayer insulating film into the semiconductor film; wherein, the third step including sub-steps of forming a silicon oxide film in contact with the semiconductor film to a first film thickness, and stacking a silicon nitride film in contact with the silicon oxide film to a second film thickness, the first film thickness being set to a value of equal or less than (the second film thickness×8000 Å)$^{1/2}$.

According to the present invention, after a silicon oxide film and a silicon nitride film are formed on a semiconductor film in the third step, the films are heated in the fourth step. Thus, hydrogen atoms contained in the silicon nitride film are introduced into the semiconductor film through the silicon oxide film. In this case, since the thickness of the silicon oxide film is varied according to the thickness of the silicon nitride film, hydrogen atoms contained in the silicon nitride film are sufficiently introduced into the semiconductor film without being blocked by the silicon oxide film.

In the thin-film transistor with the above-mentioned structure, even when a silicon nitride film is formed on the polycrystalline silicon film forming an active region via the silicon oxide film, the crystalline defects in the polycrystalline silicon film can be certainly terminated with hydrogen atoms supplied from the silicon nitride film. Therefore the requirements of the annealing process which is implemented to introduce hydrogen atoms from the silicon nitride film to the silicon oxide film can be relaxed. This feature simplifies the fabrication process, thus improving the manufacturing yield.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Next, preferred embodiments of the present invention will be described below with reference to the attached drawings.

Figure 1:
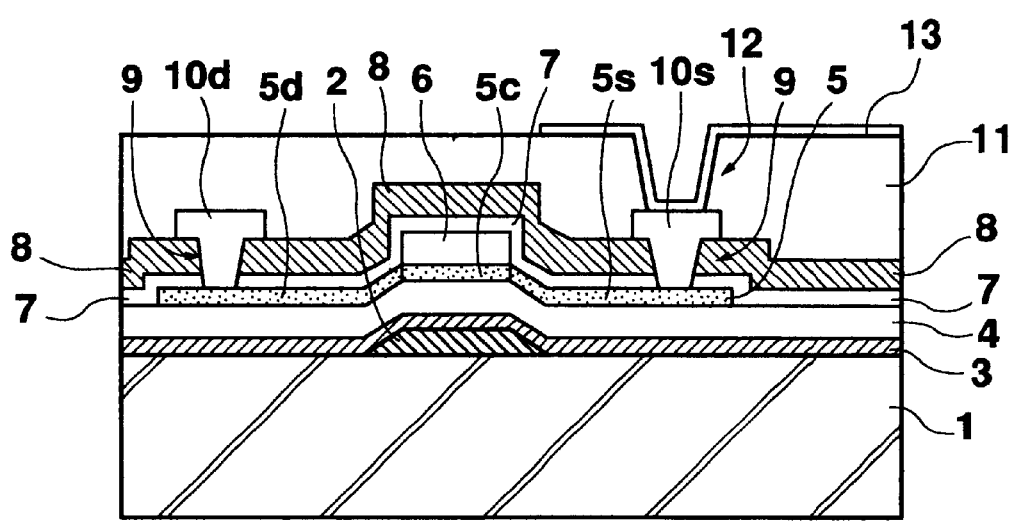
FIG. 1 is a cross sectional view illustrating the structure of a conventional thin-film transistor.
Figure 2:
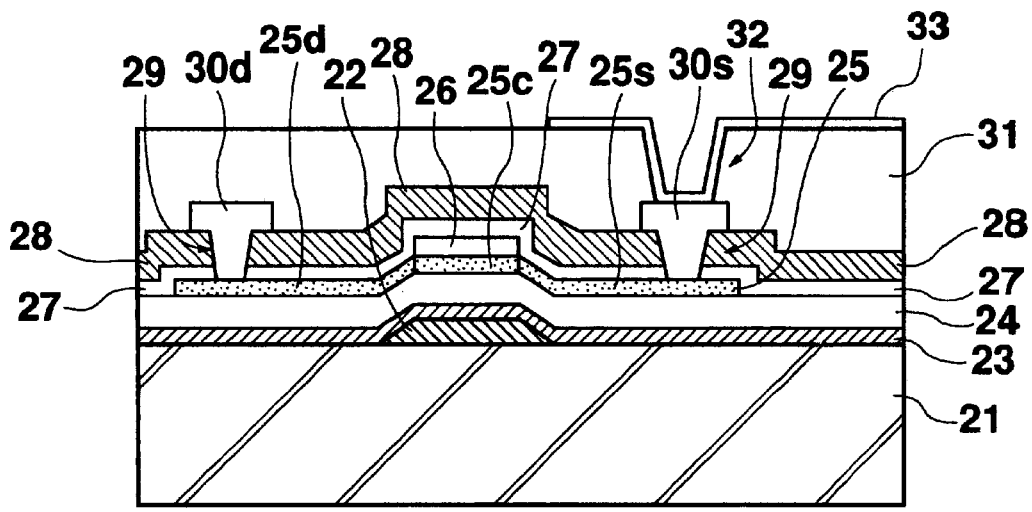
FIG. 2 is a cross-sectional view illustrating a thin-film transistor according to the first embodiment of the present invention.
Figure 3:
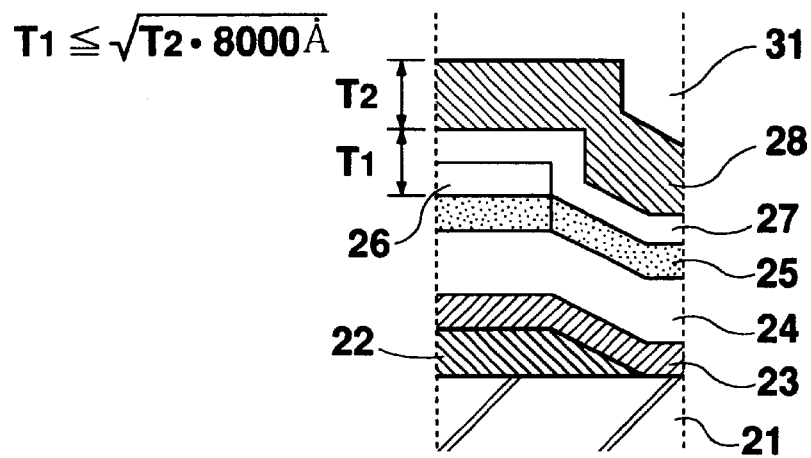
FIG. 3 is an enlarged cross sectional view illustrating the major portion of the thin-film transistor shown in FIG. 2.

FIG. 2 is a cross sectional view illustrating a thin-film transistor according to the first embodiment of the present invention. FIG. 3 is an enlarged cross sectional view illustrating the major portion of the thin film transistor of FIG. 2. Referring to FIG. 2, a transparent substrate 21 corresponds to the transparent substrate 1 of FIG. 1. A gate electrode 22 corresponds to the gate electrode 2 of FIG. 1. A silicon nitride film 23 corresponds to the silicon nitride film 3 of FIG. 1. A silicon oxide film 24 corresponds to the silicon oxide film 4 of FIG. 1. A polycrystalline silicon film 25 corresponds to the polycrystalline silicon film 5 of FIG. 1.

The gate electrode 22 is formed on the surface of the transparent substrate 21. The silicon nitride film 23 and the silicon oxide film 24, acting as a gate insulating film, are deposited so as to cover the gate electrode 22. A polycrystalline silicon film 25, being a semiconductor acting as an active region, is stacked on the silicon oxide film 24.

A stopper 26 of silicon oxide is disposed on the polycrystalline silicon film 25. The polycrystalline silicon film 25 covered with the stopper 26 acts as a channel region 25c. The remaining polycrystalline silicon film 25 acts as a source region 25s while the remaining polycrystalline silicon film 25 acts as a drain region 25d. The silicon oxide film 27 is deposited over the polycrystalline silicon film 25 on which the stopper 26 is formed. The silicon oxide film 27 can come into contact with the polycrystalline silicon film 25 without adversely affecting the polycrystalline silicon film 25. A silicon nitride film 28 containing hydrogen atoms greater than that in the silicon oxide film 27 and acting as a main hydrogen atom supply source to the polycrystalline silicon film 25 is deposited over the silicon oxide film 27. The silicon nitride film 28 and the silicon oxide film 27 construct an interlayer insulating film protecting the polycrystalline silicon film 25.

The total film thickness T1 of the stopper 26 and the silicon oxide film 27 formed over the channel region 25c is set to satisfy the following formula (1) to the film thickness T2 of the silicon nitride film 28 formed on the stopper 26:

$$T1 \leq (T2 \times 8000 \text{ Å})^{1/2} \quad (1)$$

That is, the supply amount of hydrogen atoms depends on the thickness of the silicon nitride film 28. A sufficient amount of hydrogen atoms can be supplied to the polycrystalline silicon film 25 by setting the film thickness of the silicon oxide film 27 to a smaller value according to the supply amount. According to the formula (1), when the film thickness (T2) of the silicon nitride film 28 is 2000 Å, the total film thickness (T1) of the stopper 26 and the silicon oxide film 27 is set to equal or less than about 4000 Å. When the film thickness of the stopper 26 is 2000 Å and the film thickness of the silicon oxide film 27 is 2000 Å, the film thickness of the silicon nitride film 28 must be set to equal or greater than 2000 Å.

Contact holes 29 are formed through the silicon oxide film 27 and the silicon nitride film 28 with a predetermined total film thickness so as to reach the polycrystalline silicon film 25. The source electrode 30s to be connected to the source region 25s is disposed in the contact hole 29 while the drain electrode 30d to be connected to the drain region 25d is disposed in the contact hole 29. An acrylic resin layer 31 is coated over the silicon nitride film 28 and the source electrode 30s and the drain electrode 30d for the planarization of the surface. A contact hole 32 is formed in the acrylic resin layer 31 to expose the source electrode 30s. A transparent electrode 33 is connected to the source electrode 30s and extends over the acrylic resin layer 31. The source electrode 30c, the drain electrode 30d, and the transparent electrode 33 are identical to the source electrode 10s, the drain electrode 10d, and the transparent electrode 13 of the thin-film transistor shown in FIG. 1, respectively.

In the above-mentioned thin-film transistor, the film thickness of the silicon oxide film 27 (including the stopper 26) on the polycrystalline silicon film 25 is thinned according to the film thickness of the silicon nitride film 28. Hence, in the annealing process after formation of the silicon oxide film 27 and the silicon nitride film 28, hydrogen atoms contained in the silicon nitride film 28 are sufficiently introduced into the polycrystalline silicon film 25.

Figure 4:
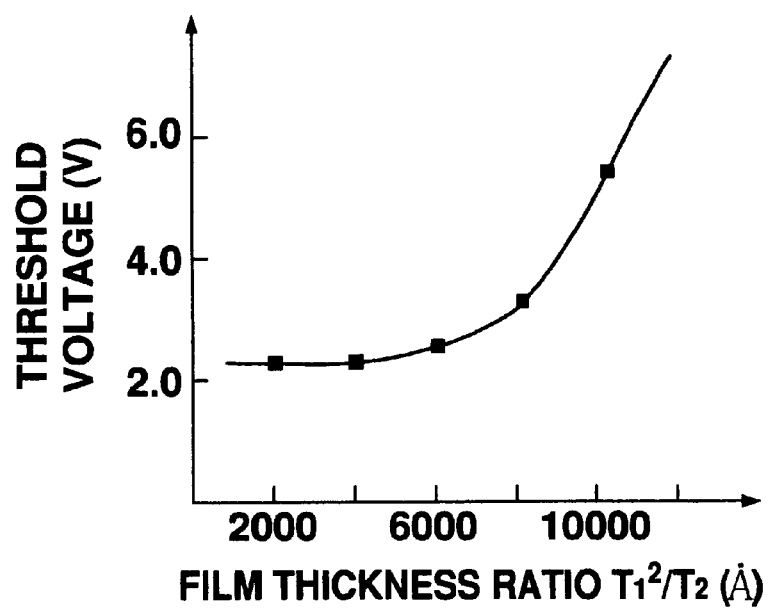
FIG. 4 is a graph plotting the relationships between threshold voltage of a thin-film transistor and film thickness ratio in an interlayer insulating film.

FIG. 4 is a graph plotting how the threshold voltage Vt of a thin-film transistor, as a yardstick for measuring the degree of crystalline defects in an active region buried with hydrogen atoms, varies according to the ratio ($T1^2/T2$) of the square of the film thickness T1 of the silicon oxide film 27 to the film thickness T2 of the silicon nitride film 28. In FIG. 4, threshold voltage Vt of a thin-film transistor actually measured are plotted by stepwise changing the film configuration ratio ($T1^2/T2$) of an interlayer insulating film from about 2000 Å to about 10000 Å. The measurement result shows that the threshold voltage Vt remains at a nearly stable, fixed value when the ratio ($T1^2/T2$) is equal or less than about 4000 Å. The threshold value Vt varies less even when the ratio ($T1^2/T2$) is equal or less than about 6000 Å. It was confirmed that the threshold value Vt varies sharply when the ratio ($T1^2/T2$) is between 8000 Å and 10000 Å. From theses results, it can be judged that the minimum condition of the ratio ($T1^2/T2$) is to set to equal or less than 8000 Å and that the optimum condition is preferably set to equal or less than 4000 Å.

Figure 5:
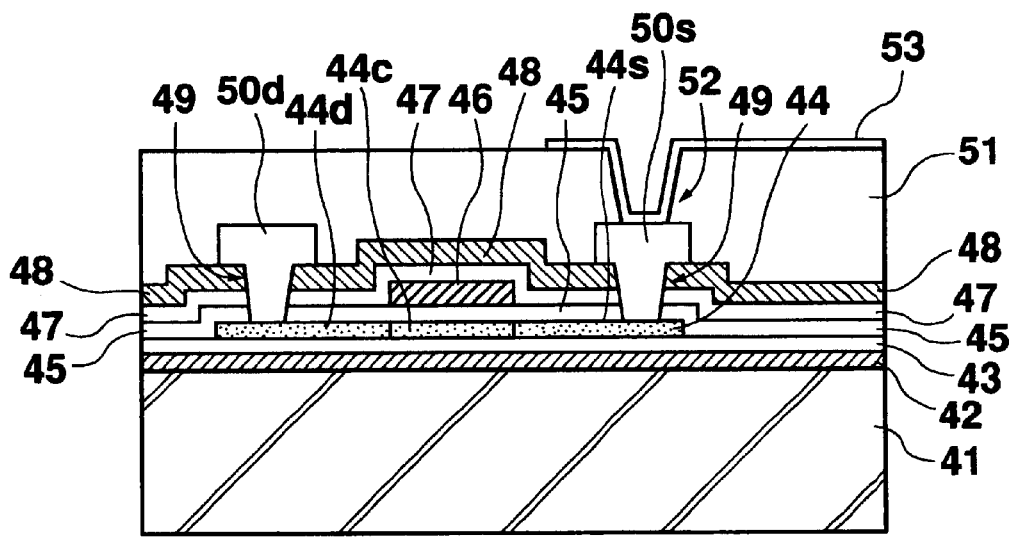
FIG. 5 is a cross sectional view illustrating a thin-film transistor according to the second embodiment of the present invention.
Figure 6:
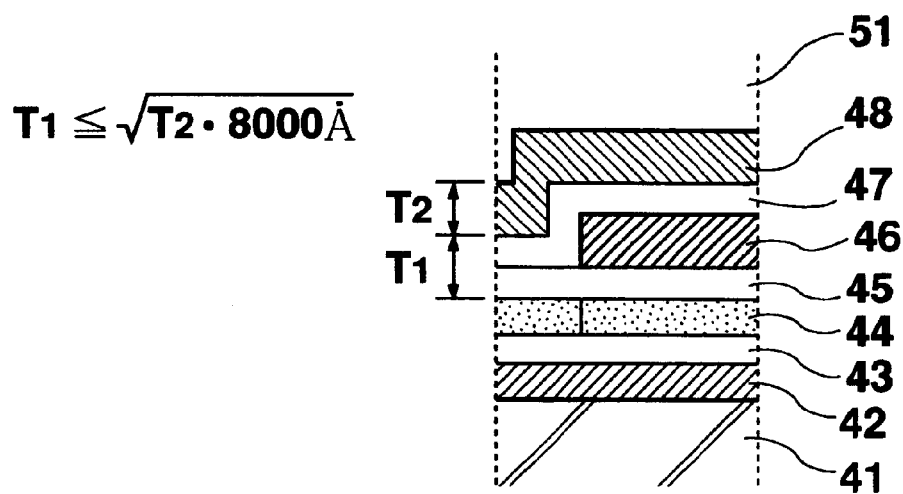
FIG. 6 is an enlarged cross sectional view illustrating the major portion of the thin-film transistor shown in FIG. 5.
Figure 7A:
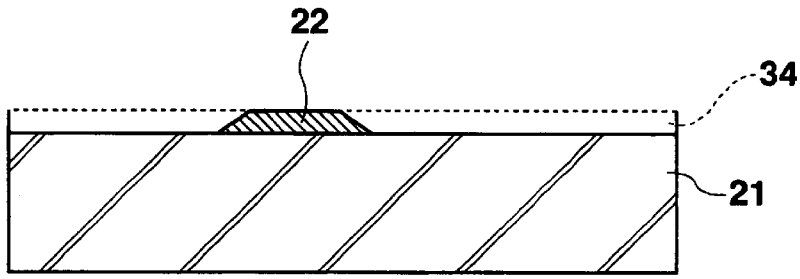
FIGS. 7A, 7B, 7C, 7D, 7E, and 7F are cross sectional views each illustrating a thin-film transistor manufacturing step according to the first embodiment of the present invention.
Figure 7B:
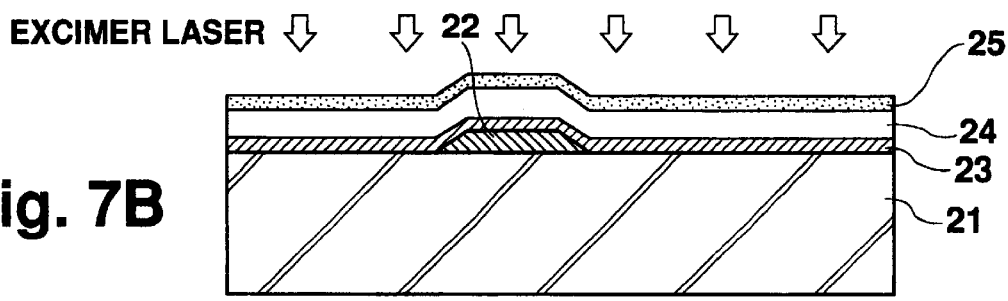
Figure 7C:
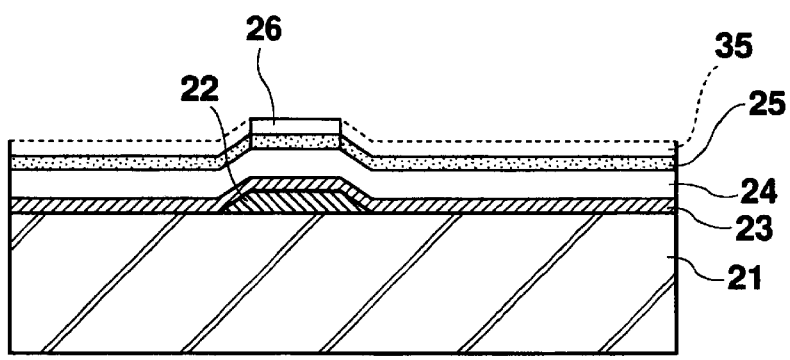
Figure 7D:
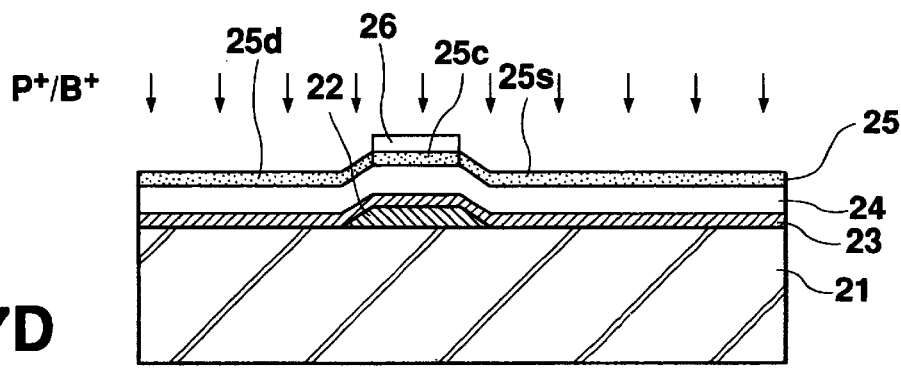
Figure 7E:
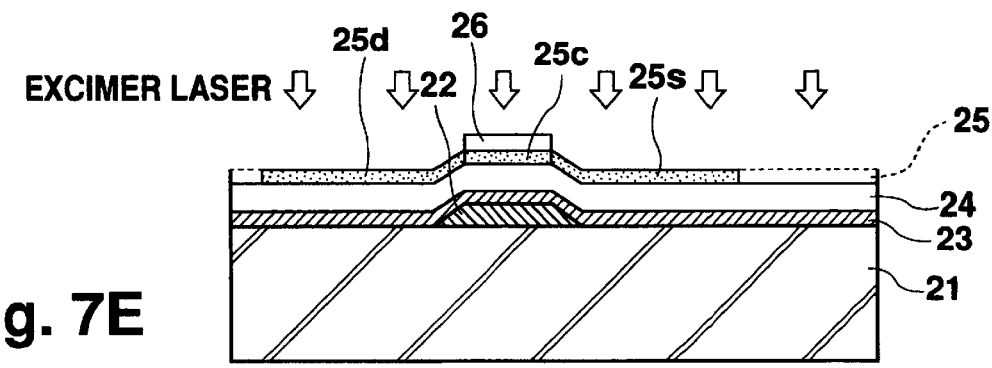
Figure 7F:
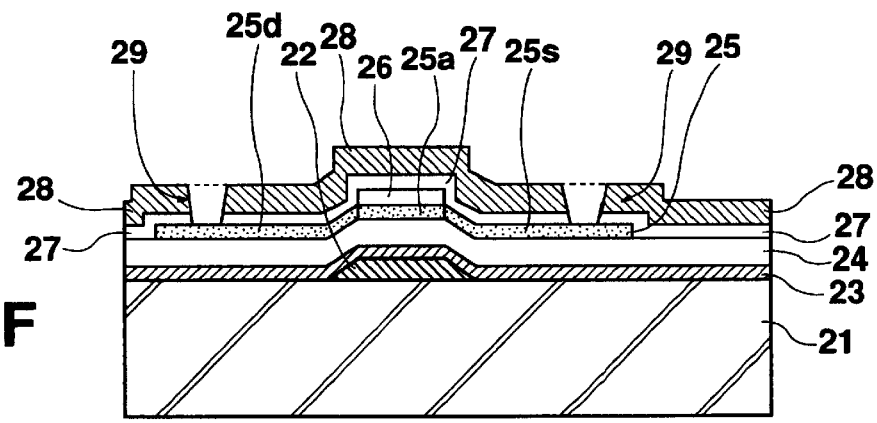
Figure 8A:
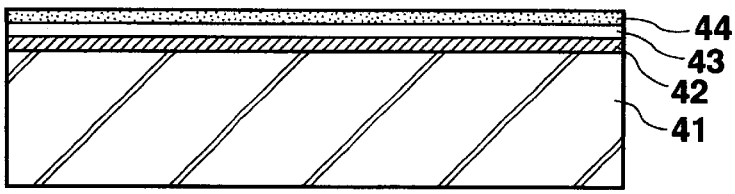
FIGS. 8A, 8B, 8C, and 8D are cross sectional views each illustrating a thin-film transistor manufacturing step according to the second embodiment of the present invention.
Figure 8B:
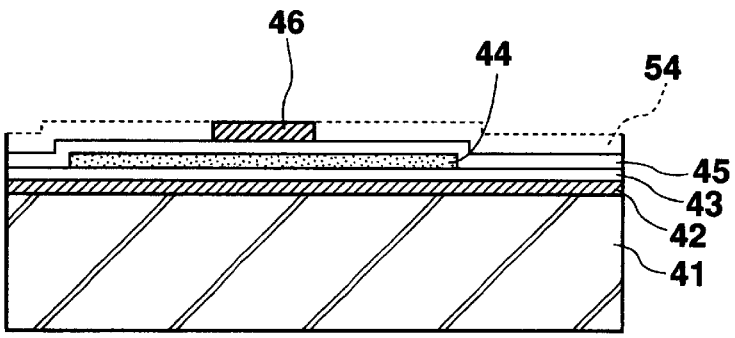
Figure 8C:
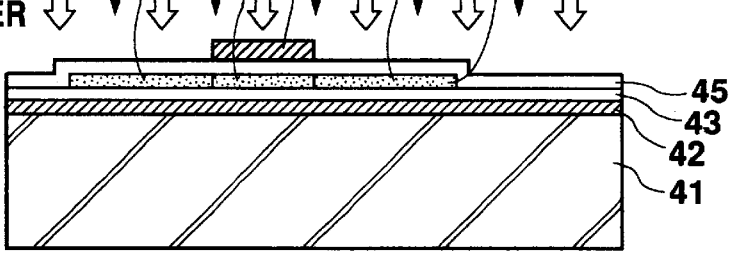
Figure 8D:
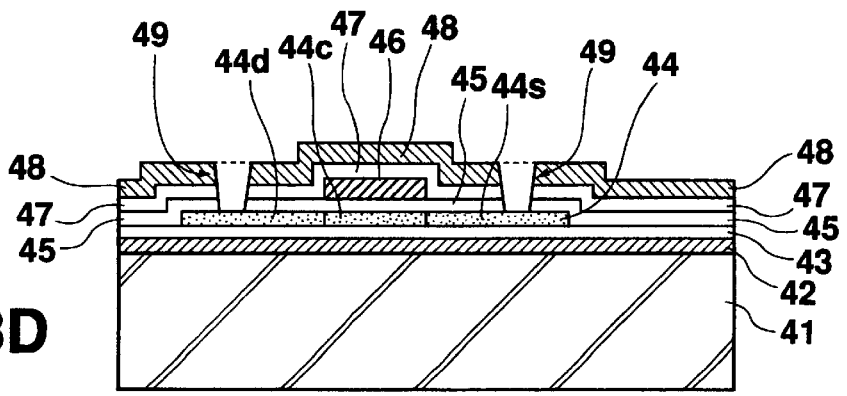

FIG. 5 is a cross sectional view illustrating a thin-film transistor according to a second embodiment of the present invention. FIG. 6 is an enlarged cross sectional view illustrating the major portion of the thin film transistor of FIG. 5. FIGS. 5 and 6 show a top gate-type thin-film transistor structure.

A silicon nitride film 42 and a silicon oxide film 43 are deposited on the surface of the insulating transparent substrate 41. The silicon nitride film 42 prevents impurity ions, such as sodium ions contained in the transparent substrate 41, from being precipitated. The silicon oxide film 43 enables the polycrystalline silicon film 44 acting as an active region to be deposited on it. The polycrystalline silicon film 44, being a semiconductor film acting as an active region of a thin film transistor, is deposited at a predetermined region on the silicon oxide film 43.

A silicon oxide film 45 acting as a gate insulating film is deposited on the silicon oxide film 45 on which the polycrystalline silicon film 44 is formed. A gate electrode 46 of a high-melting point metal such as tungsten or chromium is disposed on the silicon oxide film 45. The gate electrode 46 is disposed so as to be perpendicular to elongation of the polycrystalline silicon film 44. The region covered with the gate electrode 46 of the polycrystalline silicon film 44 acts as the channel region 44c. One remaining region of the polycrystalline silicon film 44 acts as a source region 44s while the other remaining region thereof acts as a drain region 44d. A silicon oxide film 47 and a silicon nitride film 48 are stacked on the silicon oxide film 45 and the gate electrode 46. An interlayer insulating film protecting the polycrystalline silicon film 44 is formed with the silicon oxide film 47 and the silicon nitride film 48.

The total film thickness T1 of the silicon oxide film 45 acting as a gate insulating film and the silicon oxide film 47 acting as an interlayer insulating film formed overlaying the polycrystalline silicon film 44 is set with respect to the film thickness T2 of the silicon nitride film 48 so as to satisfy the above-mentioned formula (1). The conditions for supplying hydrogen atoms to the polycrystalline silicon film 44 in the bottom gate-type thin-film transistor are the same as those in the top gate-type thin-film transistor. Hence, in a similar manner to that in the bottom gate-type thin-film transistor shown in FIG. 3, when the film thickness set by the formula (1) is satisfied, a sufficient amount of hydrogen atoms can be supplied to the polycrystalline silicon film 44.

Contact holes 49 reaching the polycrystalline silicon film 45 are formed in the silicon oxide films 45 and 47 and the silicon nitride film 48 which are formed to a predetermined total film thickness. A source electrode 50s to be connected to the source region 45s is formed in the though hole 49 while a drain electrode 50d to be connected to the drain region 45d is formed in the contact hole 49. An acrylic resin layer 51 is coated over the silicon nitride film 48, the source electrode 50s and the drain electrode 50d for planarization of the surface. The contact hole 52 reaching the source electrode 50s is formed in the acrylic resin layer 51. A transparent electrode 53 is connected to the source electrode 50s and extends over the acrylic resin layer 51. The source electrode 50s, the drain electrode 50d, and the transparent electrode 53 are respectively identical to those in the bottom gate-type thin-film transistor.

In the above-mentioned thin-film transistor, the total film thickness of the silicon oxide films 45 and 47 overlaying the polycrystalline silicon film 44 is thinned according to the thickness of the silicon nitride film 48, in a similar manner to that in the bottom gate-type thin-film transistor. Hence, a sufficient amount of hydrogen atoms contained in the silicon nitride film 48 are introduced into the polycrystalline silicon film 44.

FIGS. 7A to 7F are cross sectional views illustrating the steps 7A to 7F in a thin-film transistor producing method according to the first embodiment of the present invention. Like numerals represent the same elements as those in FIG. 2.

(a) Step 7A:

A high-melting point metal such as tungsten or molybdenum of a film thickness of 1000 Å is sputter-deposited on an insulating transparent substrate 21 to form a high-melting point metal film 34. A gate electrode 34 is formed by patterning the high-melting point metal film 34 in a predetermined form. In this patterning process, the gate electrode 22 is taper-etched so as to have both ends widened on the side of the transparent substrate 21.

(b) Step 7B:

By applying the plasma CVD method, a silicon nitride film of at least 500 Å is deposited on the transparent substrate 21 and a silicon oxide film of at least 1300 Å is successively deposited. In this step, the silicon nitride film 23 blocking impurity ions from being precipitated out of the transparent substrate 21 as well as the silicon oxide film 24 acting as a gate insulating film are formed. Then, a silicon film of 400 Å is deposited on the silicon oxide film 23 through the plasma CVD process to for an amorphous silicon film 25'. Hydrogen contained in the silicon film 25' is expelled through the heating process at about 430° C. for 1 hour or more so that the hydrogen concentration settles at equal or less than 1%. Thereafter, the amorphous silicon 25' is heated to its molten state by irradiating the excimer laser onto it. This process crystallizes the amorphous silicon to make the polycrystalline silicon film 25.

(c) Step 7C:

A silicon oxide film of 1000 Å is deposited on the polycrystalline silicon film 25 to form a silicon oxide film 35. The silicon oxide film 35 is patterned in alignment with the gate electrode 22 to form the stopper 26 overlapped on the gate electrode 22. In formation of the stopper 26, the mask displacement can be eliminated by forming a resist layer on the silicon oxide film 35 and then exposing the resist layer from the transparent substrate side, with the gate electrode acting as a mask.

(d) Step 7D:

P- or N-type impurity ions corresponding to a transistor type are doped into the polycrystalline silicon film 25 through the stopper 26. That is, P-type ions such as boron are doped to fabricate a P-channel transistor while N-type ions such as phosphorus are doped to fabricate an N-channel transistor. In this doping step, P-type or N-type conductive regions are formed in the polycrystalline silicon film 25, except at the region covered with the stopper 26. These doped regions respectively correspond to the source region 25s and the drain region 25d formed on both sides of the stopper 26.

(e) Step 7E:

The polycrystalline silicon film 25, in which the source region 25s and the drain region 25d are formed, is heated in a non-molten state, by radiating the excimer laser onto them. This step activates the impurity ions within the source region 25s and the drain region 25d. Then the polycrystalline silicon film 25 is patterned in an island form by leaving the polycrystalline silicon film 25 of a predetermined width on both sides of the stopper 26 (gate electrode 22), so that a transistor is formed in isolation.

(f) Step 7F:

By using the plasma CVD method, a silicon oxide film of 1000 Å is deposited on the polycrystalline silicon film 25 and a silicon nitride film of 3000 Å is deposited in succession. In this step, an interlayer insulating film is formed of the silicon oxide film 27 and the silicon nitride film 28. In this case, the total film thickness T1 of the stopper 26 and the silicon oxide film 27 is 2000 Å while the film thickness of the silicon nitride film 28 is 3000 Å. This satisfies the formula (1).

Thereafter, both the silicon oxide film 27 and the silicon nitride film 28 are heated in an atmosphere of nitrogen to introduce hydrogen atoms contained in the silicon nitride film 28 into the polycrystalline silicon film 25. Heating temperatures ranging 350° C. to 450° C. are suitable because a sufficient hydrogen atom diffusion can be obtained and the transparent substrate 21 is not damaged. Since the hydrogen atoms contained in the silicon nitride film 28 are introduced into the polycrystalline silicon layer 25 through the silicon oxide film 27 thinly formed according to the film thickness of the silicon nitride film 28, a necessary amount of hydrogen atoms can be reliably supplied to the polycrystalline silicon layer 25. This allows crystalline defects within the polycrystalline silicon layer 25 to be filled with the hydrogen atoms.

After completion of recovery of crystalline defects in the polycrystalline silicon layer 25 with hydrogen atoms, a contact hole 29 is formed in the silicon oxide film 27 and the silicon nitride film 28 corresponding to the source region 25s while a contact hole 29 is formed in the silicon oxide film 27 and the silicon nitride film 28 corresponding to the drain region 25d. Like the step shown in FIG. 2, a source electrode 30s and a drain electrode 30d, each of a metal such as aluminum, are respectively formed in contact holes 29. The source electrode 30s and the drain electrode 30d are formed by, for example, patterning an aluminum layer sputter-deposited on the silicon nitride film 28 in which contact holes 29 are formed.

Next, the acrylic resin layer 31 (shown in FIG. 2) is formed by coating and heating an acrylic resin solution over the silicon nitride film 28 in which the source electrode 30s and the drain electrode 30d are formed. The uneven surfaces defined by the stopper 26, the source electrode 30s and the drain electrode 30d are filled with the acrylic resin layer 31, so that a flattened surface can be provided. A through contact hole 32 is formed in the acrylic resin layer 31 on the source electrode 30s. An ITO transparent electrode 33 connected to the source electrode 30s is formed in the contact hole 32. The transparent electrode 33 is formed, for example, by patterning an ITO film sputter-deposited on the acrylic resin layer 31 in which the contact hole 32 is formed.

Thus the bottom gate-type thin-film transistor with the structure shown in FIG. 2 is completed through the above mentioned fabrication steps.

FIGS. 8A to 8D are cross sectional views illustrating a thin-film transistor manufacturing method according to the second embodiment of the present invention. The cross sectional views in FIGS. 8A to 8D correspond to the thin-film transistor structure shown in FIG. 5.

(a) Step 8A:

A silicon nitride film of at least 500 Å is deposited over the insulating transparent substrate 41 using the plasma CVD method. In succession, a silicon oxide film of 500 Å is deposited over the silicon nitride film. Then, the silicon nitride film 42 which blocks impurity ions precipitated from the transparent substrate 41 as well as the silicon oxide film 43 which allows the polycrystalline silicon film 44 to be deposited are formed on it. Moreover, by using the plasma CVD method, a silicon layer of 400 Å is deposited and an amorphous silicon film 44a is formed. Hydrogen atoms within the silicon film 44a are expelled by heating at a temperature of about 450° C. for one hour or more to reduce the hydrogen concentration to less than atm/cm$^3$ 1%. Thereafter, the amorphous silicon film 44a is heated to a molten state by irradiating an excimer laser onto it. This heating process crystallizes the silicon to the polycrystalline silicon film 44.

(b) Step 8B:

The polycrystalline silicon film 44 corresponding to the transistor forming position is patterned in a predetermined shape, so that transistors are respectively separated. After separation of the polycrystalline silicon film 44, the silicon oxide film 45 acting as a gate insulating film is formed by depositing a silicon oxide film of 1000 Å using the plasma CVD method. A high-melting point metal film 54 is formed by depositing a high-melting point metal of 1000 Å such aschromium or molybdenum using the sputter-deposition method. The high-melting point metal film 54 is patterned in a predetermined shape so as to cross the polycrystalline silicon film 44, so that the gate electrode 46 is formed.

(c) Step 8C:

P- or N-type ions corresponding to the type of a transistor to be formed are doped into the polycrystalline silicon film 44, with the gate electrode 46 acting as a mask. In the ion dope, P- or N-type conductive regions are formed in the polycrystalline silicon film 44 except the region covered with the gate electrode 46. The conductive regions correspond to the source region 44s and the drain region 44d, respectively. The polycrystalline silicon film 44 with a predetermined conductivity-type impurity ions doped is annealed in a non molten state by irradiating an excimer laser. This annealing step allows impurity ions within the source region 44s and the drain region 44d to be activated.

(d) Step 8D:

Through the plasma CVD method, a silicon oxide film of 1000 Å is deposited on the silicon oxide film 45 on which the gate electrode 46 is formed. In succession, a silicon nitride film of 3000 Å is deposited. Thus, an interlayer insulating film formed of the silicon oxide film 47 and the silicon nitride film 48 is formed. The total film thickness T1 of the silicon oxide film 45 and the silicon oxide film 47 is 2000 Å. The film thickness T2 of the silicon nitride film 48 is 3000 Å. This relationship satisfies the formula (1).

Both the silicon oxide film 47 and the silicon nitride film 48 are heated in a nitrogen atmosphere so that hydrogen atoms contained in the silicon nitride film 48 are introduced into the polycrystalline silicon film 44. This heating process is identical to that in the step of producing the bottom gate-type thin-film transistor shown in FIG. 7F. Since they are easily diffused into the interface between the polycrystalline silicon film 44 and the gate electrode 46, hydrogen atoms intrude by a roundabout route from the side surface of the gate electrode 46 to the portion covered with the gate electrode 46 of the polycrystalline silicon film 44. Hence, there is no problem even when the gate electrode 46 formed of a high-melting point metal blocks hydrogen atoms. This allows crystalline defects in the polycrystalline silicon film 44 to be filled with hydrogen atoms.

After hydrogen atoms are introduced into the polycrystalline silicon 44, contact holes 49 penetrating the silicon oxide films 45 and 47 and the silicon nitride film 48 are formed corresponding to the source region 44s and the drain region 44d. The source electrode 50s and the drain electrode 50d, formed of a metal such as aluminum, are formed in the contact holes 49 (refer to FIG. 5). In succession, the acrylic resin layer 51 is formed by coating and then heating an acrylic resin solution over the silicon nitride film 48 in which the source electrode 50s and the drain electrode 50d. The acrylic resin layer 51 overlays the uneven surface defined by the gate electrode 46, the source electrode 50s, and the drain electrode 50d to provide a flattened surface. A contact hole 52 exposing the source electrode 50s is formed in the acrylic resin layer 51. An ITO transparent electrode 53 connected to the source electrode 50s is formed in the contact hole 52.

The top gate-type thin-film transistor with the structure shown in FIG. 5 has been formed in the above-mentioned steps. The above-mentioned embodiments show that each of the portions has a film thickness of an optimum value in specific conditions. However, the present invention should not be limited only to the values exemplified in the embodiments. If the total film thickness of the silicon oxide film and the silicon nitride film overlaying the semiconductor film (polycrystalline silicon film) acting as an active region satisfies the formula (1), the object of the present invention can be accomplished.

What is claimed is:

1. A thin-film transistor comprising:

a gate electrode formed on a substrate;

a gate insulating film formed on said gate electrode formed on said substrate;

a semiconductor film formed on said gate insulating film; and an interlayer insulating film formed on said semiconductor film; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film being capable of supplying hydrogen atoms to said semiconductor film.

2. The thin-film transistor defined in claim 1, further comprising a stopper film formed on a channel region of said semiconductor film; the total thickness of said stopper film and said silicon oxide film being set to a value of equal or less than (a film thickness of said silicon nitride film×8000 Å)$^{1/2}$.

3. The thin-film transistor defined in claim 1, wherein said semiconductor film comprises a polycrystalline silicon obtained by melting and crystallizing an amorphous silicon.

4. A thin-film transistor comprising:

a semiconductor film formed on a substrate;

a gate insulating film formed over said substrate having said semiconductor film formed thereon;

a gate electrode disposed on said gate insulating film so as to cross said semiconductor film; and an interlayer insulating film formed on said gate insulating film so as to cover said gate electrode; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film being capable of supplying hydrogen atoms to said semiconductor film.

5. The thin-film transistor defined in claim 4, wherein the total thickness of said gate insulating film and said silicon oxide film is set to a value of equal or less than (a thickness of said silicon nitride film×8000 Å)$^{1/2}$.

6. The thin-film transistor defined in claim 4, wherein said semiconductor film comprises a polycrystalline silicon obtained by melting and crystallizing an amorphous silicon.

7. A thin-film transistor comprising:

a gate electrode formed on a substrate;

a gate insulating film formed on said gate electrode formed on said substrate;

a semiconductor film formed on said gate insulating film; and an interlayer insulating film formed on said semiconductor film; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film having a thickness of approximately 3,000 Å.

8. A thin-film transistor comprising:

a semiconductor film formed on a substrate;

a gate insulating film formed over said substrate having said semiconductor film formed thereon;

a gate electrode disposed on said gate insulating film so as to cross said semiconductor film; and an interlayer insulating film formed on said gate insulating film so as to cover said gate electrode; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film having a thickness of approximately 3,000 Å.

9. A thin-film transistor comprising:

a gate electrode formed on a substrate;

a gate insulating film formed on said gate electrode formed on said substrate;

a semiconductor film formed on said gate insulating film; and an interlayer insulating film formed on said semiconductor film; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film being formed in a plasma CVD method.

10. A thin-film transistor comprising:

a semiconductor film formed on a substrate;

a gate insulating film formed over said substrate having said semiconductor film formed thereon;

a gate electrode disposed on said gate insulating film so as to cross said semiconductor film; and an interlayer insulating film formed on said gate insulating film so as to cover said gate electrode; wherein, said interlayer insulating film including a silicon oxide film in contact with said semiconductor film and a silicon nitride film in contact with said silicon oxide film; the thickness of said silicon oxide film being set to a value of equal or less than (a thickness of said silicon nitride film×8000 Å)$^{1/2}$; and said silicon nitride film being formed in a plasma CVD method.

* * * * *